(12) United States Patent
Hashimoto

(10) Patent No.: US 6,448,634 B1
(45) Date of Patent: *Sep. 10, 2002

(54) TAPE CARRIER, SEMICONDUCTOR ASSEMBLY, SEMICONDUCTOR DEVICE AND ELECTRONIC INSTRUMENT

(75) Inventor: Nobuaki Hashimoto, Suwa (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/176,205

(22) Filed: Oct. 21, 1998

(30) Foreign Application Priority Data

Oct. 24, 1997 (JP) ............................................. 9-292854
Jul. 27, 1998 (JP) ............................................ 10-226483

(51) Int. Cl.⁷ ........................................... H01L 23/495
(52) U.S. Cl. ..................... 257/668; 257/690; 257/692; 257/701; 257/730; 257/784; 257/702
(58) Field of Search ............................... 257/668, 701, 257/690, 692, 698, 730

(56) References Cited

U.S. PATENT DOCUMENTS

| | | | | |
|---|---|---|---|---|
| 5,517,036 A | * | 5/1996 | Semba et al. | 257/418 |
| 5,905,303 A | * | 5/1999 | Kata et al. | 257/701 |
| 5,920,115 A | * | 7/1999 | Kimura et al. | 257/668 |
| 6,018,188 A | * | 1/2000 | Yusa | 257/668 |

FOREIGN PATENT DOCUMENTS

| | | | | |
|---|---|---|---|---|
| JP | 2-154440 | * | 2/1990 | 21/60 |
| JP | A-7-120772 | | 5/1995 | |

* cited by examiner

*Primary Examiner*—Steven Loke
*Assistant Examiner*—Nitin Parekh
(74) *Attorney, Agent, or Firm*—Oliff & Berridge, PLC

(57) ABSTRACT

A tape form substrate has a plurality of semiconductor elements arrayed in a central portion in the longitudinal direction, and first and second patterns extend laterally from the central portion of the substrate; each of the patterns comprises a plurality of wires having bonding portions with the semiconductor elements, external terminal portions connected to the bonding portions, and lead-out portions extending from the external terminal portions to the outside; and the wires are formed in a plurality of groups, with the ends of the lead-out portions of each group of wires disposed in a fixed pattern.

13 Claims, 5 Drawing Sheets

TAPE CARRIER, SEMICONDUCTOR ASSEMBLY, SEMICONDUCTOR DEVICE AND ELECTRONIC INSTRUMENT

BACKGROUND OF THE INVENTION

1. Field of the Invention

The present invention relates to a tape carrier, semiconductor assembly, and semiconductor device, to methods of manufacture thereof, and to an electronic instrument.

2. Related Art

There is no formal definition for a multi-chip module (hereafter abbreviated as "MCM"), but generally it is interpreted as a module having a plurality of chips on a substrate. To facilitate high-density mounting, the development of MCM technology is very important.

A prior example of an MCM using a flexible substrate is disclosed in Japanese Patent Application Laid-Open No. 7-120772. In this MCM each of a plurality of chips in parallel has a plurality of wires, and each wire has a test pad formed. The test pad is formed to be larger than the wire.

In this construction, when the chips are disposed at high density, in order that the plurality of wires can be made in a narrow space, and the test pads which is larger than the wires can be connected, the lead-out pattern of wires is different for each chip. For this reason, the test pad design pattern is different, and it is not possible to use the same test probe card repeatedly for each chip. There is a further problem in that since test probe cards supporting a plurality of chips must be used, the test equipment is complicated and expensive, or the number of probes must be increased and the test probe card becomes more expensive.

SUMMARY OF THE INVENTION

The object of the present invention is the provision of a tape carrier, semiconductor assembly, and semiconductor device, methods of manufacture thereof, and an electronic instrument, such that using existing test equipment as far as possible, the burden of equipment and special technology development can be lightened, and an inexpensive test probe card used without increasing the number of probes.

(1) The tape carrier of the present invention has a substrate in a tape form on which are arrayed a plurality of semiconductor elements in a longitudinal direction;

a first pattern extending in a first direction along a width of the substrate; and a second pattern extending in a second direction along the width of the substrate, each of the first and second patterns comprising an array of a plurality of wires having bonding portions with the semiconductor elements, external terminal portions connected to the bonding portions, and lead-out portions lead outward from the external terminal portions, and in at least one of the first and second patterns, the wires divided into a plurality of groups, and ends of lead-out portions of the wires in each of the groups disposed in a particular pattern corresponding to probes for test.

According to an aspect of the present invention, since the ends of lead-out portions of wires forming a group are disposed in a particular pattern, the same test probe card can be used when probes are contacted with these ends. This construction is a tape carrier with a pattern formed on a substrate, and as far as possible a conventional TAB (Tape Automated Bonding) production line and existing technology can be used, reducing the burden of equipment and special technology development. Moreover, by repeating testing of the pattern of the tape carrier (functioning as a part of the final product (MCM)) using the ends of the lead-out portions, the whole tape carrier can be tested. In this way, since test equipment in existing processes can be utilized, with no extra investment in equipment, the tape carrier for the MCM with a plurality of semiconductor elements mounted can be tested, and an inexpensive MCM tape carrier can be obtained.

(2) In this tape carrier, the wires in each of the groups may become shorter in sequence of their array from outside one to center one.

According to this construction, since the length of the wires becomes shorter from the outside to the center, the positions of the ends of adjacent lead-out portions are varied. By means of this, the spacing between adjacent lead-out portions is increased, and inexpensive probes of coarse pitch can be used, allowing the cost of inspection to be reduced.

(3) In this tape carrier, the wires in each of the groups may be formed in a given repeating pattern.

According to this construction, when the pattern is formed by lithography, the same mask can be used repeatedly, and therefore the mask design and fabrication processes and inspection operation can be made more efficient.

(4) In this tape carrier, each of the ends of the lead-out portions of the wires in each of the groups may be in a form of a test pad.

(5) In this tape carrier, the external terminal portions of the wires in each of the groups may be formed with the same pitch.

According to this construction, the connection to the external portions of the MCM can be formed at the same pitch. By means of external terminal portions of the same pitch, it is made easier to detect formation faults in the inspection process.

(6) In this tape carrier, in only one of the first and second patterns, the wires may form the plurality of groups, and the wires in another of the first and second patterns may be fewer in number than the wires in the one of the first and second patterns.

(7) The semiconductor assembly of the present invention includes a plurality of semiconductor elements having a plurality of electrodes; and a tape carrier on which the semiconductor elements are arrayed in a longitudinal direction, the tape carrier having a substrate, a first pattern extending in a first direction along a width of the substrate, and a second pattern extending in a second direction along the width of the substrate, each of the first and second patterns having an array of a plurality of wires including bonding portions connected to the semiconductor elements, external terminal portions connected to the bonding portions, and lead-out portions lead outward from the external terminal portions, and in at least one of the first and second patterns, the wires divided into a plurality of groups, and ends of the lead-out portions of the wires in each of the groups disposed in a particular pattern corresponding to probes for test.

According to this construction, when inspection is carried out using the ends of the lead-out portions of the wires of each group, since these ends are disposed in a particular pattern, the inspection process is very greatly simplified. Then, by simply repeating the inspection process for the whole semiconductor device (MCM), since the MCM is a collection of repeating individual semiconductor elements, the whole MCM can be inspected.

Furthermore, the test equipment used for testing the tape carrier can be used for the test equipment for testing by contacting probes with the ends of the lead-out portions. This means that test equipment in an existing process can be utilized, and thus no extra investment in test equipment is required for testing the semiconductor assembly, and as a result an inexpensive semiconductor assembly can be obtained.

(8) In this semiconductor assembly, the wires in each of the groups may be connected to one of the semiconductor elements.

By means of this, by carrying out testing in a repeated manner using the ends of the lead-out portions of the wires for each individual semiconductor element, the whole semiconductor assembly can be inspected.

(9) In this semiconductor assembly, the semiconductor elements may be mounted with their surfaces having the electrodes facing the bonding portions.

According to this construction, since the semiconductor elements are mounted in the face-down orientation, the semiconductor element electrodes can be connected to the pattern with the minimum intervening distance. The result of this is that the inductance is low, and a semiconductor assembly of excellent high frequency characteristics can be obtained. Furthermore, compared with the wire bonding and other such methods of mounting, the very thinnest result can be obtained.

(10) In this semiconductor assembly, the electrodes of the semiconductor elements may be connected facing the bonding portions, and a resin may be disposed between the surface having the electrodes and the substrate.

According to this construction, the pattern formed on the substrate and the surface of the semiconductor elements having the electrodes are covered by a resin, and thus the ingress of water is eliminated and the reliability is improved. Further, since the semiconductor element and substrate are unified by the resin, damage to the bonding portions caused by thermal stress in the heat cycle is kept to a minimum, and the reliability is improved.

According to this construction, since the semiconductor elements are mounted in the face-down orientation, the semiconductor element electrodes are connected to the pattern with the minimum intervening distance. Thus the inductance is low, and a semiconductor assembly of excellent high frequency characteristics can be obtained. Furthermore, compared with the wire bonding and other such methods of mounting, the very thinnest result can be obtained.

(11) The semiconductor device of the present invention comprises a plurality of semiconductor elements having a plurality of electrodes;

a substrate in a tape form on which are arrayed the semiconductor elements in a longitudinal direction;

a first pattern extending in a first direction along a width of the substrate; and a second pattern extending in a second direction along the width of the substrate, each of the first and second patterns including an array of a plurality of wires having bonding portions connected to the semiconductor elements, and external terminal portions connected to the bonding portions, in one of the first and second patterns the wires are formed more in number than in another of the first and second patterns, and in at least the one of the first and second patterns in which the wires are formed more in number, the external terminal portions are formed with a same pitch, and ends thereof are coplanar with a side edge of the substrate.

(12) The semiconductor device of the present invention may be obtained from the semiconductor assembly described above, by cutting off and removing at least ones of the lead-out portions of the wires forming the groups together with the substrate.

This construction yields a semiconductor device in which after completing inspection of the semiconductor assembly, then only good items are selected and taken to the final form. Since the lead-out portions are cut off and removed, the external terminal portions are positioned at the external edge of the final product.

(13) The electronic instrument of the present invention has the above-mentioned semiconductor device.

(14) The method of fabricating a tape carrier of the present invention comprises a first step of forming a first pattern extending in a first direction along a width of the substrate and a second pattern extending in a second lateral direction along the width, on a substrate in a tape form; and a second step of inspecting the first and second patterns, each of the first and second patterns including an array of a plurality of wires having bonding portions with the semiconductor elements, external terminal portions connected to the bonding portions, and lead-out portions lead outward from the external terminal portions, in at least one of the first and second patterns, the wires divided into a plurality of groups, and ends of the lead-out portions of wires in each of the groups disposed in a particular pattern corresponding to probes for test, and the second step including an inspection in which the probes are disposed to correspond to the particular pattern, and the probes are simultaneously put on the ends of the lead-out portions disposed in the particular pattern.

By this method, the tape carrier described above can be obtained.

(15) The method of fabricating a semiconductor assembly of the present invention comprises a first step of mounting a plurality of semiconductor elements having a plurality of electrodes on a tape carrier; and a second step of inspecting the semiconductor elements, the tape carrier comprising a substrate, a first pattern extending in a first direction along a width of the substrate, and a second pattern extending in a second direction along the width of the substrate, each of the first and second patterns including an array of a plurality of wires having bonding portions connected to the semiconductor elements, external terminal portions connected to the bonding portions, and lead-out portions lead outward from the external terminal portions, and in at least one of the first and second patterns, the wires divided into a plurality of groups, and ends of lead-out portions of the wires in each of the groups disposed in a particular pattern corresponding to probes for test, and the second step including an inspection in which the probes are disposed to correspond to the particular pattern, and the probes are simultaneously put on the ends of the lead-out portions of the wires disposed in the particular pattern.

By this method, the semiconductor assembly described above can be obtained.

(16) In this method of fabricating a semiconductor assembly, in the first step, surfaces of the semiconductor elements having the electrodes may face the bonding portions so that the electrodes and the bonding portions may be positioned before the connection is made.

(17) In this method of fabricating a semiconductor assembly, the wires in each of the groups may be connected to one of the semiconductor element; and the second step may be carried out once for each semiconductor element.

(18) This method of fabricating a semiconductor assembly may further comprise: a step in which faulty ones of the semiconductor elements discovered in the second step are replaced by good ones.

(19) This method of fabricating a semiconductor assembly may further comprise: a step in which after confirming that all semiconductor elements are good, a resin is injected between the surface of the semiconductor elements having the electrodes and the substrate, and the resin is cured.

According to this method, the semiconductor elements are inspected, and then faulty semiconductor elements are replaced with good ones as required, and then a resin is injected. Therefore, particularly in a face-down mounting method in which replacing faulty semiconductor elements is difficult after the resin has been cured, the proportion of good semiconductor assemblies can be increased. Furthermore the fabrication cost of the semiconductor devices can be reduced.

(20) The method of fabricating a semiconductor device of the present invention comprises a first step of mounting a plurality of semiconductor elements having a plurality of electrodes on a tape carrier;

a second step of inspecting the semiconductor elements, the tape carrier comprising a substrate, a first pattern extending in a first direction along a width of the substrate, and a second pattern extending in a second direction along the width of the substrate, each of the first and second patterns including an array of a plurality of wires having bonding portions with the semiconductor elements, external terminal portions connected to the bonding portions, and lead-out portions lead outward from the external terminal portions, and in at least one of the first and second patterns, the wires divided into a plurality of groups, and ends of lead-out portions of the wires in each of the groups disposed in a particular pattern corresponding to probes for test, and the second step including an inspection in which the probes are disposed to correspond to the particular pattern, and the probes are simultaneously put on the ends of the lead-out portions disposed in the particular pattern; and a third step in which at least the lead-out portions of the wires forming the groups are cut off and removed together with the substrate.

According to this method, since the lead-out portions are cut off and removed, the external terminal portions are positioned at the edge of the final product. Further, according to this method, since the inspection of the semiconductor elements is completed, the proportion of good semiconductor devices being produced can be very greatly increased, and product cost of the semiconductor device can be reduced.

(21) The method of fabricating a semiconductor device of the present invention comprises a step of fabricating a semiconductor assembly by the method described above, and cutting off and removing at least the lead-out portions of the wires forming the group together with the substrate.

This method yields a semiconductor device in which after completing inspection of the semiconductor assembly, only good items are selected and taken to the final form. Since the lead-out portions are cut off and removed, the external terminal portions are positioned at the edge of the final product. Since the inspection is completed at the semiconductor assembly stage, the proportion of good semiconductor devices can be greatly increased, and the semiconductor device product cost can be reduced.

PREFERRED EMBODIMENTS OF THE INVENTION

The present invention is now described in terms of preferred embodiments, with reference to the drawings.

In the present embodiment, using TAB (Tape Automated Bonding) technology for all or part of the fabrication process, by means of tape carrier fabrication, fabrication of an MCM-type semiconductor assembly and an MCM-type semiconductor device as a final product is achieved. According to the method of the present embodiment, a conventional TAB production line and an existing technology thereof can be used as far as possible, whereby the equipment requirements and the burden of development of special technology can be reduced. As well as enabling the fabrication of high density MCM semiconductor devices with high reliability, the yield thereof can also be increased. For each of the tape carrier, semiconductor assembly, and semiconductor device, the configuration and the method of fabrication are described below in detail.

Tape Carrier

Figure 1:
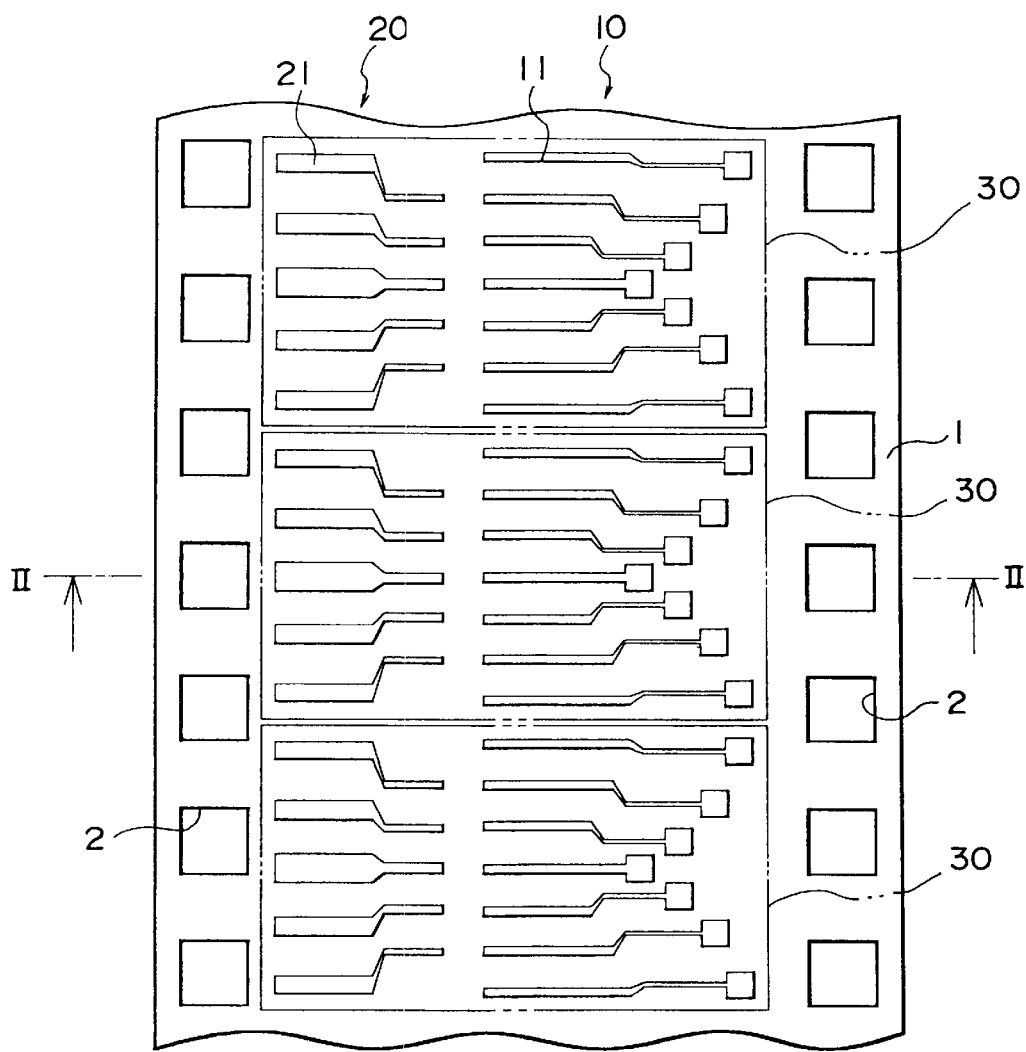
FIG. 1 is a plan view of an embodiment of a tape carrier in the present invention.
Figure 2:
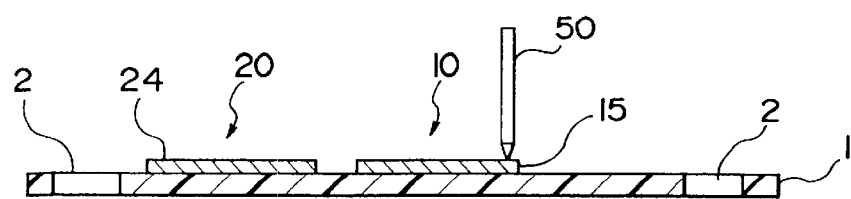
FIG. 2 is a section along the line II—II in FIG. 1.

An embodiment of the tape carrier obtained according to the present invention is described with reference to FIGS. 1 to 3. FIG. 1 shows the tape carrier, and FIG. 2 is a section along the line II—II in FIG. 1.

The tape carrier shown in FIG. 1 has a substrate 1 in which are provided sprocket holes 2, and on which are formed a first pattern 10 and second pattern 20. In the substrate 1 may also be formed, other via holes, outer lead holes, inner lead holes, and so forth in addition to the sprocket holes 2, as required.

The first and second patterns 10 and 20 are frequently plated with tin, solder, gold, or the like, (not shown in the drawings). The plating is used to prevent oxidation of test terminals, semiconductor element mounting terminals, and component input/output terminals, and also for forming an alloy for connection.

The substrate 1 frequently uses a polyimide film of thickness 25 $\mu$m to 125 $\mu$m, but for cost reduction, a polyester film, glass epoxy film, polyamide film, or a similar organic film may also be used. The above-mentioned tape carrier may be fabricated by a known TAB substrate fabrication process or FPC (Flexible Printed Circuit) substrate fabrication process. The TAB substrate fabrication process generally is based on a continuous substrate material of length 40 m to 300 m or thereabouts. The FPC substrate fabrication process is based on a substrate material of a particular work size. The substrate 1 of the tape carrier obtained by the present embodiment is continuous when formed by a TAB substrate fabrication process, and of a work size when formed by an FPC substrate fabrication process. By cutting a continuous substrate 1 a short tape carrier can be obtained. The substrate 1 of the tape carrier of the work size formed by an FPC substrate fabrication process is at least of a length and width so as to include the MCM-type semiconductor device described below.

The following are examples of methods of forming the first and second patterns 10 and 20.

(a) A copper leaf is adhered to an organic film of polyimide or the like in which a particular pattern of openings has been formed, and which has previously had adhesive applied, and thereafter is etched to form the patterns 10 and 20 (three-layer substrate).

(b) A copper layer is formed on a polyimide or other organic film by vapor deposition, plating, CVD, or other method, and thereafter appropriate openings are formed, and by etching the patterns 10 and 20 are formed (two-layer substrate).

(c) On a copper leaf, polyimide or the like is applied as a varnish, to form an organic film, and thereafter appropriate openings are formed, and the patterns 10 and 20 are formed by etching (two-layer substrate).

In addition to these methods of forming by etching (subtractive methods), the patterns 10 and 20 may be directly formed by vapor deposition, plating, CVD, or the like (additive methods), and combinations thereof are known. In the present embodiment, the patterns 10 and 20 may be formed by any method. As the patterns 10 and 20 is commonly use copper of a thickness of 5 µm to 35 µm. In the present embodiment, plating leads for electroplating are not provided, and therefore electroless plating is assumed. By providing plating leads for electroplating connected to the wires, electroplating can be used for the plating.

The width of the substrate 1 of the tape carrier may be determined according to the subsequent fabrication method and the form of the final product, but for optimum use of the TAB fabrication equipment, a width of 35, 48, 70, or 125 mm is generally preferable.

A tape carrier formed in this way, even though there are differences between a continuous form and a short form, forms apparently a similar tape carrier to that of a TAB tape. The selection of continuous form or short form may be determined in such a way as to reduce the investment in the fabrication process and the product technology risk, with the consideration of the subsequent fabrication process. Selecting a short form tape carrier is preferable in that the waste is reduced by making the length an integral multiple of the length required for the final MCM-type semiconductor device.

Next, the details of the first and second patterns 10 and 20 of the tape carrier are described. As shown in FIG. 1, the first and second patterns 10 and 20 each have a plurality of wires 11 and 21 forming arrays. One group of the wires 11 and one group of the wires 21 form a repetition pattern 30. The tape carrier comprises a plurality of the repetition patterns 30.

Figure 3:
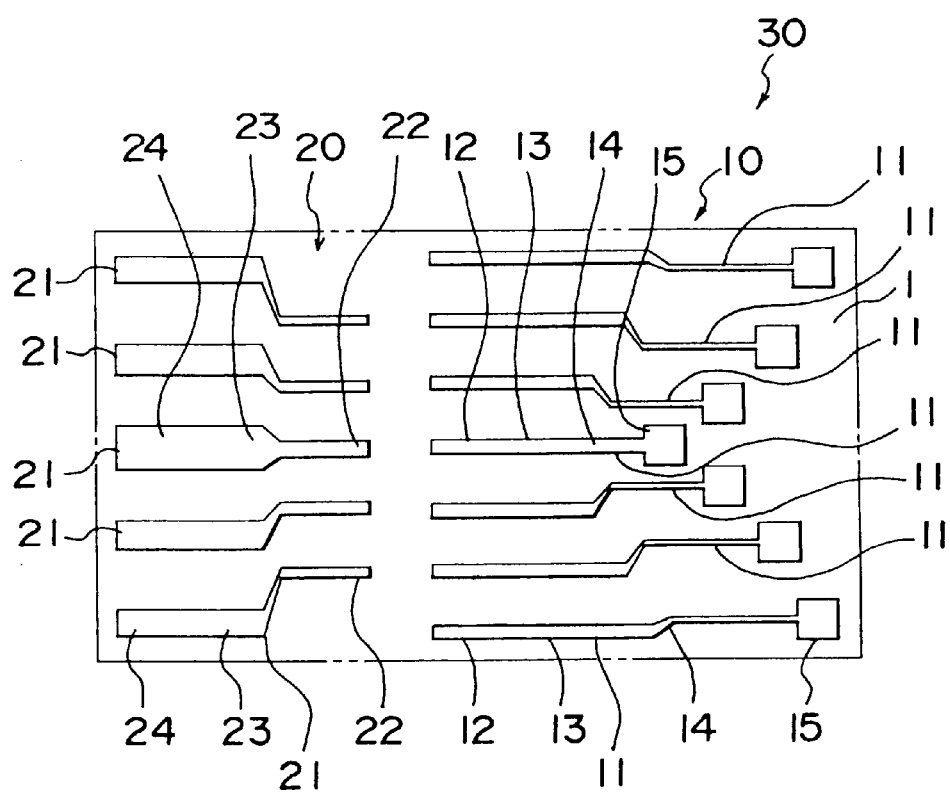
FIG. 3 illustrates the repetition pattern of the tape carrier in an embodiment of the present invention.

FIG. 3 shows a single repetition pattern 30. In the repetition pattern 30, wires 11 of the first pattern 10 extend laterally in one direction from the center of the substrate 1, and are arrayed along the longitudinal direction of the substrate 1. The wires 11 comprise bonding portions 12 positioned in the central part of the substrate 1, external terminal portions 13 connected to the bonding portions 12, and lead-out portions 14 extending from the external terminal portions 13 to the outside.

The ends of the lead-out portions 14 are enlarged to form test pads 15, but may equally be terminated without enlargement. The bonding portions 12 are used for connection to a semiconductor element 40 described below. The test pads 15 are used for a test using probes. At the tape carrier stage, the wires 11 are tested, and after a semiconductor assembly is obtained, the semiconductor element 40 itself or connections to the semiconductor element 40 are tested.

The external terminal portions 13 form the external terminals of the finished semiconductor device. For one group of wires 11 within each repetition pattern 30, the external terminal portions 13 are formed at the same or substantially the same pitch.

The group of wires 11 in the repetition pattern 30 become shorter in sequence of disposition from the outside toward the center. More specifically, each wires 11 is different from each other in length extending laterally from the central region of the substrate 1 as the origin. As a result, as shown in FIG. 3, the positions of the test pads 15 formed by the ends of the lead-out portions 14 are varying toward the center of the substrate 1, in the disposing sequence of the wires 11 from the outside to the center. In this way, the positions of the test pads 15 of the wires 11 varies along the longitudinal direction of the wires 11, whereby the spacing between adjacent test pads 15 can be increased. By means of this, even bold and inexpensive probes can be used to contact a single test pad 15. In the present embodiment, a plurality of the repetition pattern 30 is formed, and for each of the repetition pattern 30 a group of wires 11 is formed in a particular pattern, and the test pads 15 are disposed in a particular pattern. It should be noted that the test pads 15 may equally be disposed in a zigzag pattern.

Next, the wires 21 of the second pattern 20 are described. The wires 21 are fewer in number than the wires 11 described above. Therefore, when a semiconductor element having more outputs than inputs is mounted, the wires 11 form the output wires, and the wires 21 form the input wires.

The wires 21 of the second pattern 20 extend laterally in another direction from the center of the substrate 1, and are arrayed along the longitudinal direction. The wires 21 comprise bonding portions 22 positioned in the central part of the substrate 1, external terminal portions 23 connected to the bonding portions 22, and lead-out portions 24 extending from the external terminal portions 23 to the outside.

The bonding portions 22 are used for connection to a semiconductor element 40 described below. The external terminal portions 23 form the external terminals of the finished semiconductor device. For one group of wires 21 within each repetition pattern 30, the external terminal portions 23 are formed at substantially the same pitch. In the present embodiment, the external terminal portions 23 are the input terminals from the semiconductor element 40, but they may equally be used as output terminals. It should be noted that the external terminal portions 23 and lead-out portions 24 are formed integrally. The lead-out portions 24 are not separated in the final product, the external terminal portions 23 and lead-out portions 24 integrally form external terminals.

In the present embodiment, the wires 21 are formed at the same distance in the lateral direction of the substrate 1 in FIG. 3, but as with the wires 11 described above, the lengths of the wires 21 may be varied.

The repetition pattern 30 is formed to correspond to the semiconductor element 40 to be mounted in a subsequent semiconductor element assembly process. That is to say, for one semiconductor element 40, one repetition pattern 30 is formed.

According to the present embodiment, since in the first pattern 10 the spacing between adjacent test pads 15 is enlarged, bold and inexpensive probes can be used in the subsequent tape carrier inspection process, and semiconductor element assembly inspection process. The position and size of the test pads 15 are determined by the density of the wires 11 and the probe cost. Because such a design is adopted, when a continuous form is used for the tape carrier, the tape carrier of the present embodiment of the invention is fabricated by using a exposure mask for the repetition pattern for each semiconductor element in a exposure step of a TAB fabrication process. Since the same exposure mask can be used repeatedly when the tape carrier is created, the mask design, fabrication operation, and inspection operation efficiency can be increased.

Next, the tape carrier inspection process is described. In the inspection process, as shown in FIG. 2, a test probe 50 is contacted with the test pads 15. If required, the test probe 50 can be contacted with ends of the lead-out portions 24 of the second pattern 20. With a tape carrier as described above, the test probe 50 used in this process may be bold and inexpensive.

It should be noted that as when measuring a normal TAB tape carrier, a plurality of test probes 50 is preferably disposed in a probe card, for the repetition pattern 30 for each semiconductor element as a set. If this is done, a plurality of test probes 50 can be simultaneously contacted with a plurality of test pads 15 for the semiconductor element 40. Then, the whole of the MCM tape carrier can be measured in the same way as when continuously measuring conventional individual TAB tape carriers.

More specifically, adjacent test pads 15 of the wires 11 are measured, and short-circuit defects in the wires 11 are detected. Further, between conductive rubber (not shown in the drawings) pressed against the bonding portions 12 of the wires 11 and the test pads 15, open-circuit defects of the wires 11 are detected. The method of inspection adopted may be determined according to the degree of complexity of the product, and the fault characteristics thereof. When an FPC fabrication process is used, the process following the inspection in the short form is the same, and for each semiconductor element, the whole of an MCM tape carrier can be measured. The test probes 50 are not restricted to the pin form shown in the drawings; probes using conductive rubber or bumps have been proposed, and these may equally be used. In addition to an electrical inspection, and external appearance check may be employed. In addition to electrical faults (open-circuit and short-circuit), external appearance faults (for example, pattern narrowing, missing portions, widenings, projections, resist unevenness, and so forth) can preferably be inspected for. In this case, if the external terminal portions 13 are formed at substantially the same pitch, in the inspection process faults in the pattern can easily be detected. In other words, it is easier to detect faults in a repeated pattern.

The tape carrier may, if required, have a solder resist formed on the pattern, and the location of faults may be indicated explicitly by marks or punched holes, in the same way as is carried out for a conventional TAB or FPC. Depending on the mounting method of the semiconductor element to be described below, a tape carrier (BTAB, transfer bumps) having bumps formed on the bonding portions 12 corresponding to the electrodes of the semiconductor element may be used.

Positioning marks (not shown in the drawings) for mounting the semiconductor element 40 described below may be formed on the substrate 1. For example, marks may be formed from the same material as the patterns 10 and 20 near the position of mounting of the semiconductor element, at the same time that the patterns 10 and 20 are formed. This is most preferable from the viewpoint of cost and positioning precision.

MCM-type Semiconductor Assembly

Figure 4:
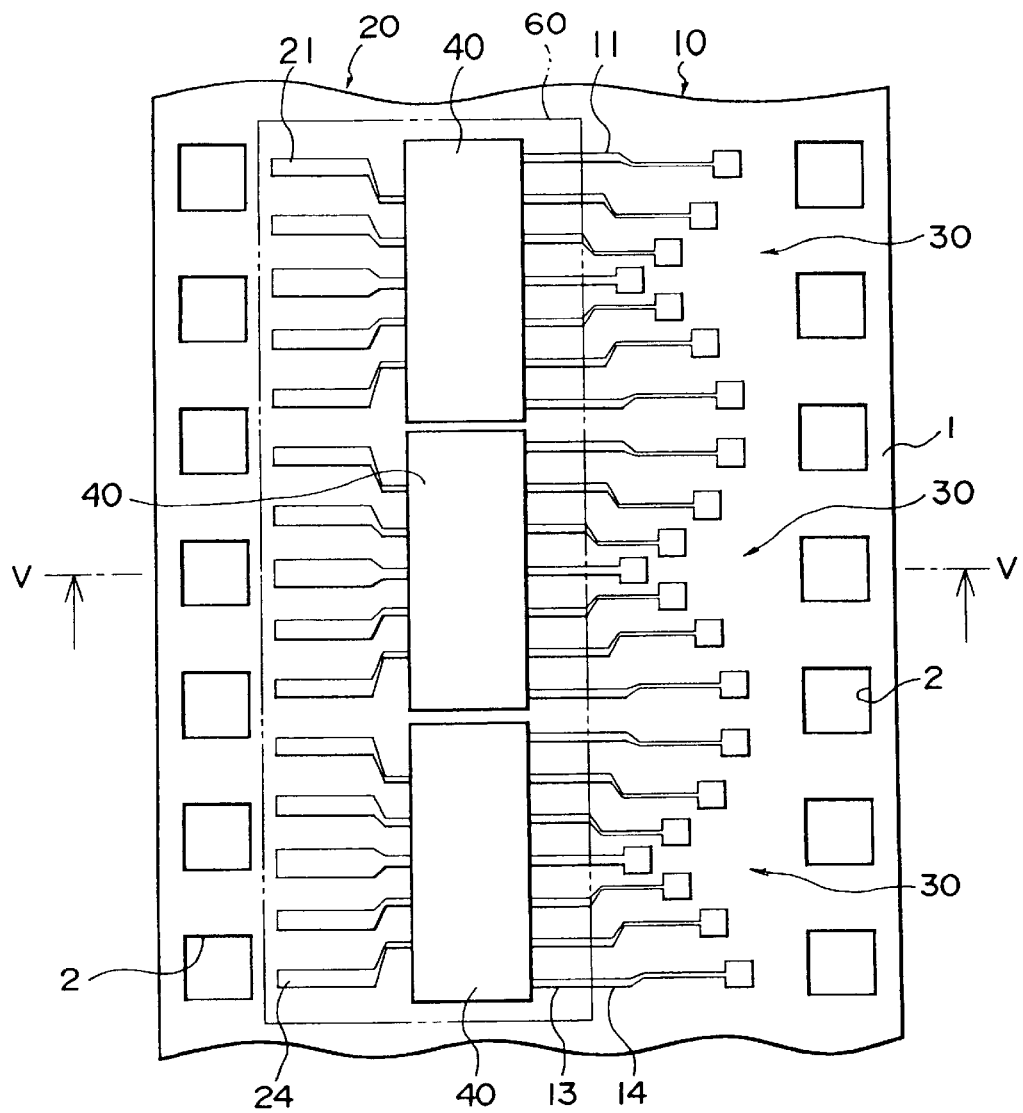
FIG. 4 is a plan view of a semiconductor assembly in an embodiment of the present invention.
Figure 5:
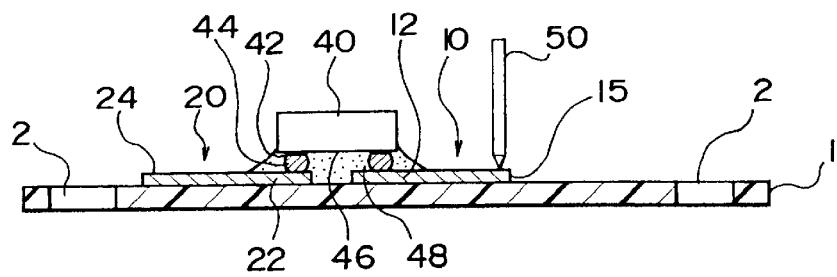
FIG. 5 is a section along the line V—V in FIG. 4.

Next, an MCM-type semiconductor assembly fabricated using the above-described tape carrier is described. FIG. 4 shows an MCM-type semiconductor assembly of the present embodiment, and FIG. 5 is a section along the line V—V in FIG. 4.

As shown in these figures, a plurality of semiconductor elements 40 is mounted on a tape carrier (see FIG. 1). At this time, as the tape carrier has sprocket holes 2, the semiconductor elements 40 can be positioned using these holes as reference and mounted. Further, when positioning precision is required, positioning marks (not shown in the drawings) can be formed on the substrate 1 as described above, and the semiconductor element 40 can be mounted after confirming the positioning.

Bumps 44 are formed on the electrodes 42 of the semiconductor element 40. The surface 46 having the electrodes 42 is disposed facing the bonding portions 12. Then through the bumps 44, the electrodes 42 of the semiconductor element 40 and the bonding portions 12 and 22 of the wires 11 and 21 are connected. Between the surface 46 having the electrodes 42 of the semiconductor element 40 and the substrate 1 is filled with resin 48, protecting the electrodes 42, the bumps 44, the bonding portions 12 and 22, and so forth. The bumps 44 are mostly formed of gold or solder. When the method in which an alloy is formed between the bumps 44 and the bonding portions 12 and 22 is adopted as the method of mounting the semiconductor element 40, a tape carrier in which the wires 11 and 21 are plated with gold, solder, tin, or the like is frequently used. In the present embodiment, a substrate which is not flexible, such as a printed circuit board substrate, a ceramic substrate, or the like may also be used as the substrate 1.

The bonding portions 12 and 22 are positioned with respect to bumps 44 on the electrodes 42 of the semiconductor element 40, and energy (heat, or pressure if required) is supplied from the reverse side of the semiconductor element 40 to form an alloy. Then, a liquid resin 48 is injected between the semiconductor element 40 and the substrate 1, and cured to complete the mounting.

As another method of mounting, if an anisotropic conducting film or anisotropic conducting adhesive is used, first the anisotropic conducting film or anisotropic conducting adhesive is disposed on the substrate, then the bonding portions are positioned with respect to the bumps on the electrodes of the semiconductor element. The anisotropic conducting film or anisotropic conducting adhesive has a configuration that conducting particles are dispersed in a resin. Then heat is applied from the reverse side of the semiconductor element, and pressure is applied if necessary. In this way, the anisotropic conducting film or anisotropic conducting adhesive is cured, whereby the connection and mounting is completed. This process has no step of injecting resin after connection, and therefore it can often result in a simpler process than the above-described method of forming an alloy. This process is carried out for a plurality of semiconductor elements to fabricate a semiconductor assembly. Face-down mounting using an anisotropic conducting film or anisotropic conducting adhesive is widely used in volume production for liquid crystal mounting. For this reason, mounting equipment, liquid crystal panel mounting equipment such as faulty semiconductor replacement equipment, and the process know-how thereof, can be exploited with the process of the present embodiment. Therefore the benefit is obtained that a low level of equipment investment is sufficient, and high reliability can be obtained relatively simply.

According to this construction, between the surface of the semiconductor element having the electrodes (the surface on which active elements are formed) and the substrate, the anisotropic conducting film or anisotropic conducting adhesive contributing to the bonding is present as an insulating resin. Therefore, a step separate from the bonding step in which a resin is injected is unnecessary, as a result of which there is the advantage that the MCM fabrication process is simplified, and the MCM fabrication cost can be reduced.

According to this construction, between the semiconductor element electrodes and the bonding portions where conductivity must be established, the conducting particles dispersed in the anisotropic conducting film or anisotropic conducting adhesive are compressed. Conductivity is stably established only in this compressed portion, and in other portions, the conducting particles of the anisatropic conducting film or anisotropic conducting adhesive are not compressed. A stably insulating resin is thus provided. Therefore, the effect is equivalent to the surface for forming active elements of the semiconductor element being covered with an insulating resin, moisture does not collect in the surface forming the active elements. There again, there is the benefit that the reliability of the semiconductor device with respect to moisture is improved.

Moreover, by means of the anisotropic conducting film or anisotropic conducting adhesive equivalent to an insulating resin between the semiconductor element and the substrate, when the pattern is formed on the substrate, moisture also does not collect there. Therefore, there is the benefit that the reliability of the semiconductor device with respect to moisture is improved.

The present embodiment is described according to the face-down method (the method of mounting in which the surface of the semiconductor element on which the active elements are formed and the surface of the substrate on which the pattern is formed are opposing), but various face-down methods are known, and any of these methods can be used. In a method of mounting carried out by the face-down method, the electrodes 42 of the semiconductor element 40 and the patterns 10 and 20 are connected with the minimum distance, and therefore since the inductance is reduced, a semiconductor assembly with excellent high frequency characteristics can be obtained. Further, compared with other methods of mounting such as the wire bonding method, the overall thickness of the MCM can be made minimum, and the thickness of the final product can also be made minimum, thus further enabling the product value to be increased. According to the present embodiment, since the resin 48 is present between the surface 46 having the electrodes 42 of the semiconductor element 40 (the active element forming surface) and the substrate 1, the patterns 10 and 20 formed on the substrate 1 and the surface of the semiconductor element 40 on which the active elements are formed are covered by the resin, the ingress of water is eliminated and the reliability is improved. Further, since the semiconductor element 40 and substrate 1 are unified by the resin 48, damage to the connections by thermal stress during the heat cycle can be kept to a minimum, and thus the reliability is improved.

Furthermore, in view of relations with existing equipment and ease of mounting technology, there is no obstacle to a wire bonding method being selected and mounting carried out instead of the face-down method. In this case, the electrodes of the semiconductor element die-bonded on the substrate are connected to the pattern by wires of gold, aluminum, copper or the like. Further, the semiconductor element and pattern resin are potted, and cured to form a semiconductor assembly. The resin protects the surface of the semiconductor element on which the active elements are formed and the wires, and also the connection pattern, when there are intervening processes for the inspection and replacement of faulty semiconductor elements, these are described below. In any event, by whatever method, the semiconductor element is mounted on the substrate.

Next, as shown in FIG. 5, using the test pads 15 used for inspection of the tape carrier, the semiconductor element 40 is subjected to electrical testing. If required, testing can be carried out using the ends of the lead-out portions 24 of the second pattern 20. In FIG. 5, a test probe 50 is contacted with a test pad 15 (if required, the lead-out portions 24). The same test probe 50 as was used in inspection of the tape carrier can be used. In this step too, the test probes used may be bold and inexpensive as in the inspection of the tape carrier described above. It should be noted that here too, a plurality of test probes 50 disposed in a probe card is preferable. The benefits of this are the same as described above for the tape carrier inspection.

When the inspection is finished, good items are passed to the next step, being a semiconductor device fabrication steps or can be shipped as assemblies to a customer.

If faulty semiconductor elements 40 discovered in the testing are replaced, so that all of the semiconductor assemblies should be good, the process is designed to make replacement (reworking) of the semiconductor element 40 easier during mounting of the above-described semiconductor element 40.

For example, in the case in which face-down mounting is used and solder or gold bumps 44 is used for mounting of the semiconductor element 40, is described by way of example. In this case, after connection by means of the bumps 44 and before the resin 48 is injected, the above-described inspection is carried out, and faulty semiconductor elements 40 are heated and removed. A good semiconductor element 40 is repositioned, is heated and subjected to pressure, and then retesting is carried out. When all of the semiconductor elements 40 are good, the resin 48 is injected between the semiconductor element 40 and the substrate 1, and cured to complete the mounting process. By this means, all of the semiconductor assemblies are good.

When an anisotropic conducting film or anisotropic conducting adhesive is used, after mounting is initially completed, the above-described inspection is carried out, and faulty semiconductor elements are heated and removed, and excess anisotropic conducting film or anisotropic conducting adhesive is removed. Thereafter, the uncured anisotropic conducting film or anisotropic conducting adhesive is replaced, a good semiconductor element is repositioned, is heated and subjected to pressure, and retested. In this way, if the process ships only good items, all of the semiconductor assemblies are good. Alternatively, if the anisotropic conducting film or anisotropic conducting adhesive is partially cured (the heating temperature is less than the temperature for complete curing), inspection and replacement of faulty semiconductor elements can be carried out in this state. By this means, during the replacement operation, faulty semiconductor elements can be removed relatively easily. Furthermore, in this case, after inspection and replacement of faulty semiconductor elements, the anisotropic conducting film or anisotropic conducting adhesive is completely cured (the heating temperature is raised to the temperature for complete curing), and mounting is finished. In the case that the wire bonding method is used for mounting, the above-described inspection is carried out after wire bonding, faulty semiconductor elements are replaced by good semiconductor elements, and the wire bonding is repeated and the inspection repeated. In this way if a process ships only good items, all of the semiconductor assemblies are good. After the inspection process, resin potting is carried out, and curing carried out to provide a semiconductor assembly.

Further if required, using the test pads 15 and test probe 50 the semiconductor element 40 can be burnt-in. That is to say, in the same manner as the above-described inspection, the test probe 50 supplies burn-in electrical signals to the semiconductor element 40, and after the burn-in is completed in the heated state, the above inspection or reworking is carried out. In this way, all of the semiconductor assemblies, once burnt-in, are good items. This enables burn-in, which was difficult to implement with a conventional MCM, and is a great benefit of application of the present invention.

MCM-type Semiconductor Device

Figure 6:
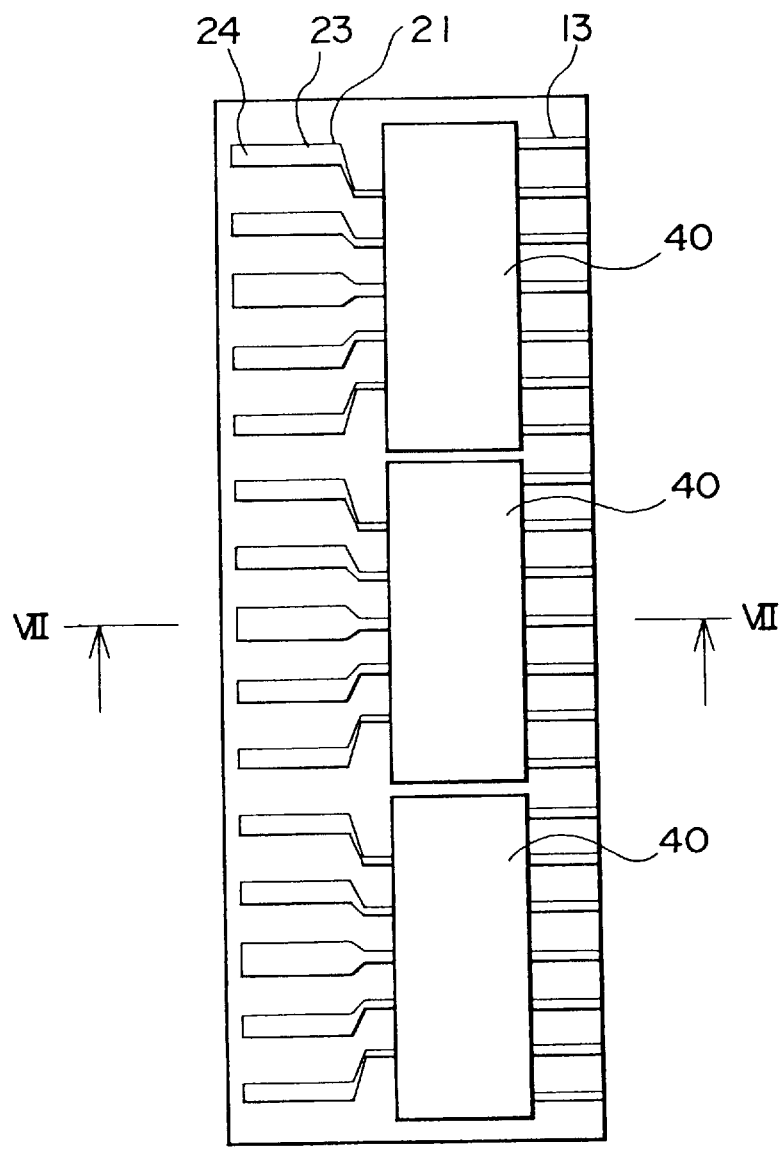
FIG. 6 is a plan view of the semiconductor device in an embodiment of the present invention.
Figure 7:
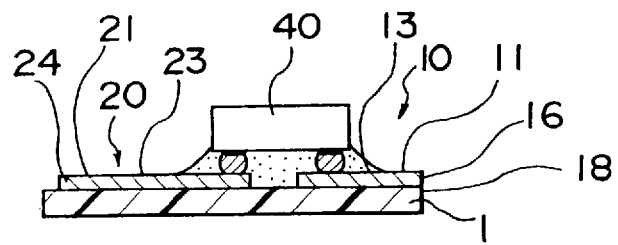
FIG. 7 is a section along the line VII—VII in FIG. 6.

FIG. 6 is a plan view of an MCM-type semiconductor device as a final product, and FIG. 7 is a sectional view along the line VII—VII in FIG. 6. Specifically, a good semiconductor assembly obtained as described above is cut to the outline 60 shown in FIG. 4, and constitutes an MCM-type semiconductor device as the final product. Cutting to the outline 60 often uses a method employing the sprocket holes 2 for positioning.

In the first pattern 10, the outline 60 is positioned at the boundary between the external terminal portions 13 and lead-out portions 14 of the wires 11. That is to say, the lead-out portions 14 are cut off and removed. On the other hand, in the pattern 20, the outline 60 is positioned outside the lead-out portions 24, and the wires 21 are not cut. However, similar to the wires 11, the wires 21 may also be cut on the boundary between external terminal portions 23 and lead-out portions 24.

In this way, a part of the first pattern 10 is cut off and removed together with the substrate 1, to obtain the MCM-type semiconductor device shown in FIGS. 6 and 7. With this semiconductor device, end surfaces 16 of the large number of wires 11 are coplanar with the side surface 18 of the substrate 1.

Signals, voltage or current are applied to the semiconductor element 40 from the external terminal portions 23 of the second pattern 20, and are output from the external terminal portions 13 of the first pattern 10. In many cases, the input external terminal portions 23 are connected to a previous stage circuit board or the like having a drive circuit, by means of a connector, soldering, or the like, and the output external terminal portions 13 are connected to a following stage driven circuit or the like having an LCD or the like, by an anisotropic conducting film or the like. According to the MCM application, these connections may vary, and a connecting form most suited to the application (for example, electrical contacts) may be selected.

An MCM-type semiconductor device thus obtained has already been tested at low cost in a previous steps and found to be good, even though it has fine external terminal portions 13 on the output side. Therefore, the process fault ratio of the final product in which the MCM-type semiconductor device is incorporated can be remarkably reduced.

Figure 8:
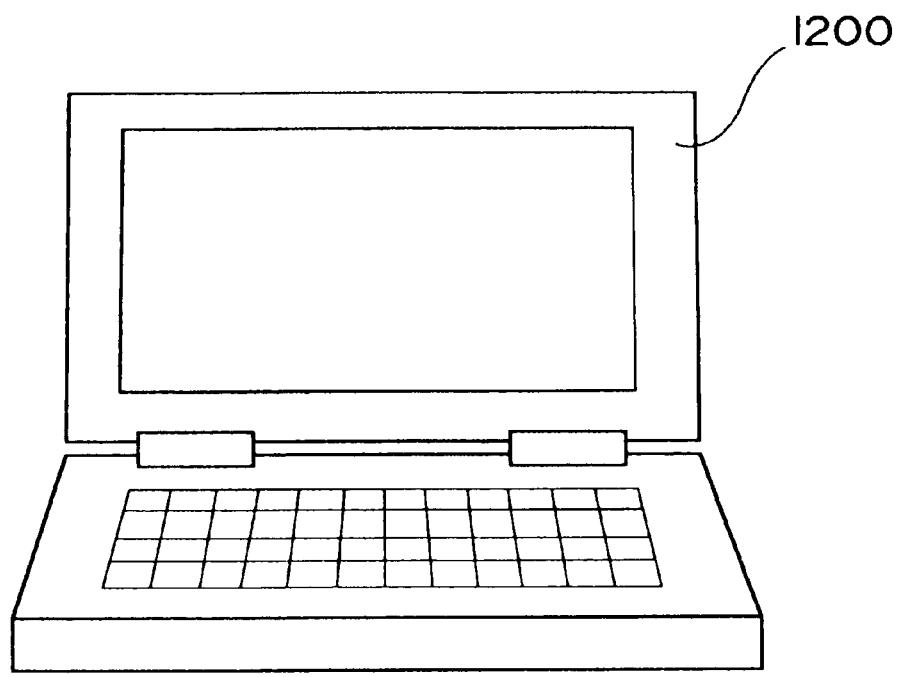
FIG. 8 illustrates an electronic instrument in an embodiment of the present invention.

Additionally, in FIG. 8 is shown an electronic instrument 1200 incorporating the MCM-type semiconductor device described above.

What is claimed is:

1. A tape carrier comprising:

a substrate in a tape form to mount thereon a plurality of semiconductor elements in a longitudinal direction;

a first pattern formed on the substrate and extending toward a first edge along a width of the substrate, the first pattern comprising an array of a plurality of wires having bonding portions for electrical connection to the semiconductor elements, external terminal portions connected to the bonding portions, and lead-out portions positioned closer to the first edge than the external terminal portions; and a second pattern formed on the substrate and extending toward a second edge opposite to the first edge along the width of the substrate, the second pattern comprising an array of a plurality of wires having bonding portions for electrical connection to the semiconductor elements, external terminal portions connected to the bonding portions, and lead-out portions positioned closer to the second edge than the external terminal portions, wherein in at least one of the first and second patterns, the wires are divided into a plurality of groups, and ends of the lead-out portions of the wires of at least one of the groups of the patterns is disposed at varying positions such that a length of the lead-out portions of the wires is shorter from the outside to the center from at least one of the edges to accommodate probes for testing.

2. The tape carrier of claim 1, wherein the wires in each of the groups are formed in a given repeating pattern.

3. The tape carrier of claim 1, wherein each of the ends of the lead-out portions of the wires in each of the groups are in a form of a test pad.

4. The tape carrier of claim 1, wherein the external terminal portions of the wires in each of the groups are formed with a same pitch.

5. The tape carrier of claim 1, wherein in only one of the first and second patterns, the wires form the plurality of groups, and the wires in another of the first and second patterns are fewer in number than the wires in the one of the first and second patterns.

6. A semiconductor assembly comprising:

a plurality of semiconductor elements having a plurality of electrodes;

a substrate in a tape form on which are arrayed the semiconductor elements in a longitudinal direction;

a first pattern formed on the substrate and extending toward a first edge along a width of the substrate, the first pattern having an array of a plurality of wires including bonding portions connected to the semiconductor elements, external terminal portions connected to the bonding portions, and lead-out portions positioned closer to the first edge than the external terminal portions; and a second pattern formed on the substrate and extending toward a second edge opposite to the first edge along the width of the substrate, the second pattern having an array of a plurality of wires including bonding portions connected to the semiconductor elements, external terminal portions connected to the bonding portions, and the lead-out portions positioned closer to the second edge than the external terminal portions, wherein in at least one of the first and second patterns, the wires are divided into a plurality of groups, and ends of the lead-out portions of the wires of at least one of the groups of the patterns is disposed at varying lengths such that a length of the lead-out portions of the wires is shorter from the outside to the center from at least one of the edges to accommodate probes for testing.

7. The semiconductor assembly of claim 6, wherein the wires in each of the groups are connected to one of the semiconductor elements.

8. The semiconductor assembly of claim 6, wherein the semiconductor elements are mounted with their surfaces having the electrodes facing the bonding portions.

9. The semiconductor assembly of claim 8, wherein the electrodes of the semiconductor elements are connected facing the bonding portions, and a resin is disposed between the surfaces having the electrodes and the substrate.

10. A semiconductor device obtained from the semiconductor assembly of claim 6, by cutting off and removing at least ones of the lead-out portions of the wires forming the groups together with the substrate.

11. An electronic instrument having the semiconductor device of claim 10.

12. A tape carrier comprising:

a substrate in a tape form to mount thereon a plurality of semiconductor elements in a longitudinal direction;

a first pattern formed on the substrate and extending toward a first edge along a width of the substrate, the first pattern comprising an array of a plurality of wires having bonding portions for electrical connection to the semiconductor elements, external terminal portions connected to the bonding portions, and lead-out portions positioned closer to the first edge than the external terminal portions; and a second pattern formed on the substrate and extending toward a second edge opposite to the first edge along the width of the substrate, the second pattern comprising an array of a plurality of wires having bonding portions for electrical connection to the semiconductor elements, external terminal portions connected to the bonding portions, and lead-out portions positioned closer to the second edge than the external terminal portions, wherein in at least one of the first and second patterns, the wires are divided into a plurality of groups, and ends of the lead-out portions of the wires of at least one of the groups of the first and second patterns are disposed at varying positions such that at least one of the lead-out portions of the wires disposed at the center of the at least one of the groups is the shortest, and another of the lead-out portions of the wires disposed at an outer part in the at least one of the groups is one of the longest, whereby accommodating probes for testing.

13. A semiconductor assembly comprising:

a plurality of semiconductor elements having a plurality of electrodes;

a substrate in a tape form on which are arrayed the semiconductor elements in a longitudinal direction;

a first pattern formed on the substrate and extending toward a first edge along a width of the substrate, the first pattern having an array of a plurality of wires including bonding portions connected to the semiconductor elements, external terminal portions connected to the bonding portions, and lead-out portions positioned closer to the first edge than the external terminal portions; and a second pattern formed on the substrate and extending toward a second edge opposite to the first edge along the width of the substrate, the second pattern having an array of a plurality of wires including bonding portions connected to the semiconductor elements, external terminal portions connected to the bonding portions, and lead-out portions positioned closer to the second edge than the external terminal portions, wherein in at least one of the first and second patterns, the wires are divided into a plurality of groups, and ends of the lead-out portions of the wires of at least one of the groups of the first and second patterns are disposed at varying positions such that at least one of the lead-out portions of the wires disposed at the center of the at least one of the groups is the shortest, and another of the lead-out portions of the wires disposed at an outer part in the at least one of the groups is one of the longest, whereby accommodating probes for testing.

\* \* \* \* \*